United States Patent [19]

Lohninger

[11] Patent Number: 5,483,206
[45] Date of Patent: Jan. 9, 1996

[54] VOLTAGE-CONTROLLED MICROWAVE OSCILLATOR WITH MICRO-STRIPLINE FILTER

[75] Inventor: Gerhard Lohninger, Munich, Germany

[73] Assignee: Siemens Aktiengesellschaft, Munich, Germany

[21] Appl. No.: 156,823

[22] Filed: Nov. 24, 1993

[30] Foreign Application Priority Data

Dec. 1, 1992 [EP] European Pat. Off. ............ 92120501

[51] Int. Cl.⁶ .................. H03B 7/14; H01P 1/203
[52] U.S. Cl. .............. 331/107 SL; 331/107 DP; 331/96; 331/117 D; 331/177 V; 331/117 FE; 333/204; 333/205; 333/235
[58] Field of Search ................ 333/204, 205, 333/235; 331/96, 107 SL, 117 D, 107 DP, 177 V, 117 FE

[56] References Cited

U.S. PATENT DOCUMENTS

| | | | |
|---|---|---|---|
| 4,463,322 | 7/1984 | Scott et al. | 331/117 D |
| 4,481,486 | 11/1984 | Bert et al. | 331/117 D X |
| 4,518,931 | 5/1985 | Rauscher | 331/76 |
| 4,695,809 | 9/1987 | Rudelle | 331/117 D |
| 4,728,909 | 3/1988 | Rudelle | 331/117 D X |
| 4,775,845 | 10/1988 | McCoy | 331/117 FE |
| 4,871,983 | 10/1989 | Graycar | 331/96 |
| 4,891,610 | 1/1990 | Veith | 331/96 |
| 4,906,946 | 3/1990 | Mekata et al. | 331/99 |
| 5,087,896 | 2/1992 | Wen et al. | 331/117 FE |
| 5,113,155 | 5/1992 | Funada | 331/107 SL |
| 5,136,269 | 8/1992 | Seitzer et al. | 333/204 |
| 5,153,533 | 10/1992 | Lamacraft et al. | 331/107 SL |
| 5,334,961 | 8/1994 | Shirai et al. | 333/204 |

FOREIGN PATENT DOCUMENTS

| | | |
|---|---|---|
| 0061952 | 10/1982 | European Pat. Off. . |
| 0203663 | 12/1986 | European Pat. Off. . |
| 0221608 | 5/1987 | European Pat. Off. . |

Primary Examiner—Robert J. Pascal
Assistant Examiner—Arnold Kinkead
Attorney, Agent, or Firm—Hill, Steadman & Simpson

[57] ABSTRACT

A voltage-controlled microwave oscillator having a field effect transistor (1) as an amplifier and having a varactor diode (2) as a frequency-determining element has high output power and a large enough frequency sweep in the microwave frequency range that S-parameter scatters of the active components have optimally little influence on the characteristic data of the oscillator. The varactor diode (2) is preceded by a tunable micro stripline filter (3) and the source electrode of the field effect transistor (1) is directly connected to ground in order to form a parallel feedback with the micro stripline filter (3).

11 Claims, 1 Drawing Sheet

VOLTAGE-CONTROLLED MICROWAVE OSCILLATOR WITH MICRO-STRIPLINE FILTER

BACKGROUND OF THE INVENTION

The present invention is directed to a voltage-controlled microwave oscillator having a field effect transistor as an amplifier and having a varactor diode as a frequency-determining element.

Voltage-controlled microwave oscillators are known in the prior art. In such a VCO (voltage-controlled oscillator), a voltage-variable reactance, for example a capacitance diode is connected into the frequency-determining element of the oscillator. In order, namely, to synchronize the frequency of an oscillator with the frequency of another oscillation, the oscillator frequency must be varied by a DC voltage.

Known voltage-controlled microwave oscillators also contain silicon bipolar transistors or field effect transistors (FET) as an active component (negative resistance) in addition to Gunn diodes or Impatt diodes. Because relatively few bipolar transistors work efficiently at frequencies above 12 GHz, GaAs field effect transistors are employed for use for frequencies in a range from approximately 8 GHz through 12 GHz (what is referred to as the X-band). Given such FET oscillators, for example, an inductance is connected in series between a (variable capacitance) varactor diode and the gate electrode of the FET in order to obtain an oscillatory structure. Such oscillators, however, are relatively load-sensitive.

SUMMARY OF THE INVENTION

It is an object of the present invention to provide a voltage-controlled oscillator having high output power and a frequency sweep that covers the microwave frequency range, particularly frequencies of approximately 8 GHz through 12 GHz. It is a further object to provide a voltage-controlled oscillator wherein S-parameter scatters of the active components (field effect transistor, varactor diode) have optimally little influence on the characteristic data of the oscillator.

In a voltage-controlled microwave oscillator of the type initially cited, this object is inventively achieved in that the varactor diode is preceded by a tunable micro stripline filter, and in that the source electrode of the field effect transistor is directly connected to ground in order to form a parallel feedback with the micro stripline filter.

Components on the basis of gallium arsenide as compound semiconductor material are preferably employed for the field effect transistor and for the varactor diode. The micro stripline filter is advantageously a three strip filter.

A RF oscillation only arises given the parallel feedback oscillator principle when the phase and amplitude condition is satisfied in the feedback branch. When the operating voltage is applied to the field effect transistor (FET), the loop gain is greater than 1 and the signal phase is a multiple of $2\pi$. When these properties are not satisfied, no oscillation can form. The load impedance and the generator impedance are of critical significance for the output power of an oscillator. The generator impedance as well as the phase and amplitude condition are defined by the S-parameter of the FET. The influence of S-parameter scatter on the behavior of the oscillator is advantageously reduced by the fixed ground connection of the source electrode of the FET (optimally low inductance), namely, in combination with the parallel feedback of the arrangement.

Also, advantageous is the high output power of the oscillator that can be achieved with the parallel feedback, as a result whereof the scatter problem in mass production is simplified.

The frequency change of the oscillator is enabled by the varactor diode which is advantageously connected to a filter structure such that the resonant frequency and the phase response of the filter can be varied according to the voltage applied to the varactor. The transmission losses of the filter remain nearly constant in the frequency band. The real part of the input impedance of the varactor diode thereby defines the transmission losses of the filter and should therefore be expediently selected as small as possible.

The present invention has the advantage that, due to the parallel feedback concept of the oscillator with a micro stripline filter and with a micro stripline terminated with a varactor diode which influences the electrical properties of the filter, a large frequency sweep of approximately ±400 MHz is achieved. The S-parameter scatters of the FET and the varactor diode have little influence on the characteristic data of the oscillator and the output power is high.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 1:
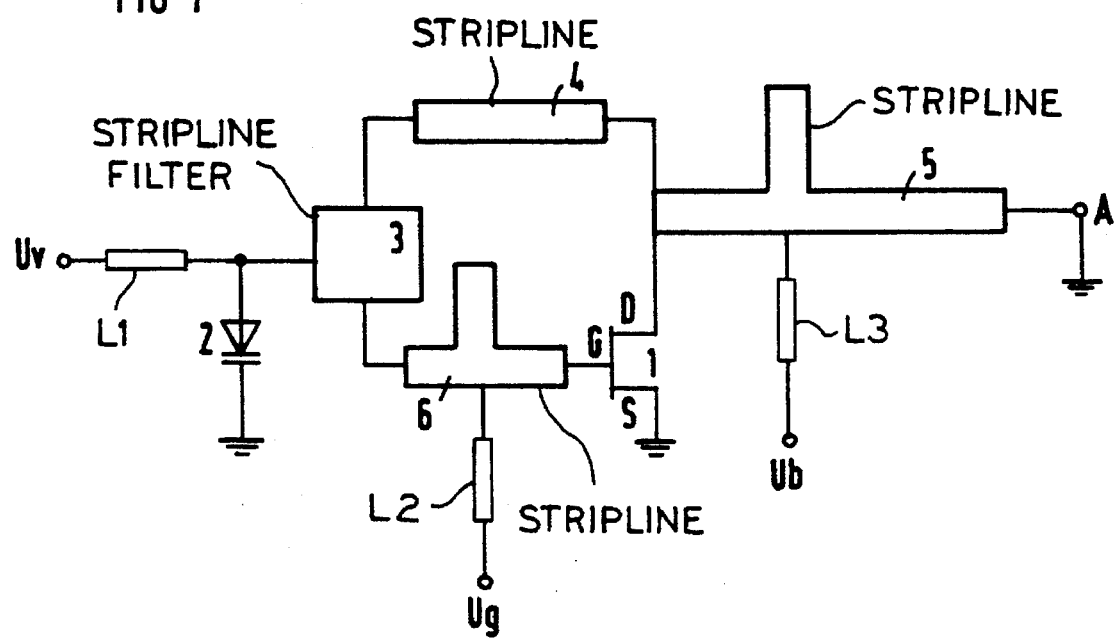
FIG. 1 is a schematic circuit diagram of the microwave oscillator of the present invention.

As an amplifier, the microwave oscillator shown in FIG. 1 has a GaAs field effect transistor 1 having a source electrode S, a drain electrode D and a gate electrode G. A GaAs varactor diode 2 is provided as a frequency-determining element, a varactor diode voltage Uv of, for example, −1 V through −12 V being applied thereto. The varactor diode 2 is preceded by a tunable micro stripline filter 3. In order to form a parallel feedback with the micro stripline filter 3, the source electrodes of the field effect transistor 1 is directly connected to ground. The striplines 4, 5 and 6 represent the necessary connections between the individual elements of the circuit arrangement. The stripline 5, is connected between a 50-ohm output A and the drain electrode D of the FET 1 and the stripline 4 leading to the stripline filter 3. The stripline 5 is provided with a stub. The stripline 6 between the gate electrode G of the FET 1 and the stripline filter 3 is also provided with a stub for tuning or matching purposes. The gate bias of the field effect transistor 1 is a voltage Ug. The operating voltage Uv amounts, for example, to +3.5 V and the operating current amounts, for example, to 18 mA. Given an operating frequency f of, for example, 11.5 GHz, the tuning range of the oscillator lies at ±400 MHz and the output power amounts to 13 dBm. The striplines of the filter 3 and of the elements to be connected are composed, for example, of copper and are expediently applied on a dielectric composed of plastic which has a relative permittivity $\epsilon_r$ of, for example 2.45. The coil symbols identify line inductances L1, L2, L3.

Figure 2:
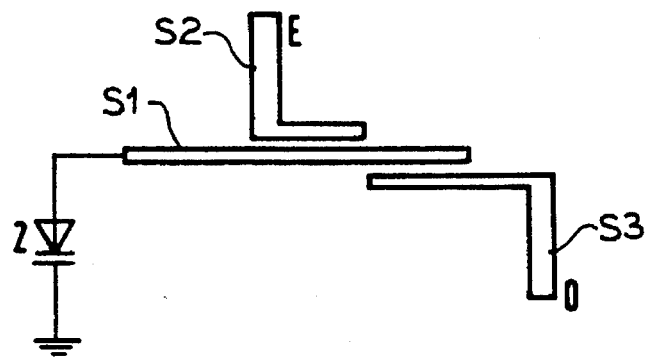
FIG. 2 is an embodiment of the micro stripline filter of the microwave oscillator.

FIG. 2 shows an embodiment of the micro stripline filter 3 employed in FIG. 1. The filter is composed of three striplines S1, S2, S3. The middle strip S1 produces the connection to the varactor diode 2 lying at ground. The two other strips S2, S3 represent the filter input E and the filter output O, respectively.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A voltage-controlled microwave oscillator having a field effect transistor as an amplifier and having a varactor diode as a frequency-determining element, comprising:

the varactor diode preceded by a tunable micro stripline filter;

a source electrode of the field effect transistor directly connected to ground for forming a parallel feedback with the micro stripline filter; and said tunable micro stripline filter having first, second and third striplines, said first stripline located between said second and third striplines.

2. The microwave oscillator according to claim 1, wherein the field effect transistor is a GaAs field effect transistor.

3. The microwave oscillator according to claim 1, wherein the varactor diode is a GaAs varactor diode.

4. A voltage-controlled microwave oscillator having an output, comprising:

a field effect transistor having a drain, a source and a gate, said source connected to ground;

a varactor diode having a varactor diode voltage applied thereacross;

a tunable micro stripline filter having first, second and third terminals, said first terminal being connected to said varactor diode;

a first stripline connected between said second terminal of said tunable micro stripline filter and said drain of said field effect transistor;

a second stripline connected between said drain of said field effect transistor and the output of the oscillator;

a third stripline connected between said gate of said field effect transistor and said third terminal of said tunable micro stripline filter to thereby provide a parallel feedback with the micro stripline filter.

5. The microwave oscillator according to claim 4, wherein said field effect transistor is a GaAs field effect transistor.

6. The microwave oscillator according to claim 4, wherein said varactor diode is a GaAs varactor diode.

7. The microwave oscillator according to claim 4, wherein said micro stripline filter is a three strip filter having first, second and third strips.

8. The microwave oscillator according to claim 7, wherein said first strip of said micro stripline filter is connected to said varactor diode, said third strip is connected to said third stripline and said second strip is connected to said first stripline.

9. A voltage-controlled microwave oscillator having an output, comprising:

a field effect transistor having a drain, a source and a gate, said source connected to ground;

a varactor diode having a varactor diode voltage applied thereacross;

a tunable micro stripline filter having first, second and third terminals, said first terminal being connected to said varactor diode;

a first stripline connected between said second terminal of said tunable micro stripline filter and said drain of said field effect transistor;

a second stripline connected between said drain of said field effect transistor and the output of the oscillator;

a third stripline connected between said gate of said field effect transistor and said third terminal of said tunable micro stripline filter to thereby provide a parallel feedback with the micro stripline filter; and said micro stripline filter being a three strip filter having first, second and third strips, said first strip being connected to said varactor diode, said third strip being connected to said third stripline and said second strip being connected to said first stripline.

10. The microwave oscillator according to claim 9, wherein said field effect transistor is a GaAs field effect transistor.

11. The microwave oscillator according to claim 9, wherein said varactor diode is a GaAs varactor diode.

\* \* \* \* \*